(12) United States Patent
Terao

(10) Patent No.: US 7,496,163 B2
(45) Date of Patent: Feb. 24, 2009

(54) AGC SYSTEM, AGC METHOD, AND RECEIVER USING THE AGC SYSTEM

(75) Inventor: Kenji Terao, Tokyo (JP)

(73) Assignee: NEC Corporation, Tokyo (JP)

( * ) Notice: Subject to any disclaimer, the term of this patent is extended or adjusted under 35 U.S.C. 154(b) by 614 days.

(21) Appl. No.: 11/007,159

(22) Filed: Dec. 9, 2004

(65) Prior Publication Data

US 2005/0129150 A1 Jun. 16, 2005

(30) Foreign Application Priority Data

Dec. 10, 2003 (JP) ............................. 2003-411131

(51) Int. Cl.
*H04L 27/08* (2006.01)
(52) U.S. Cl. ..................... 375/345; 375/318; 375/340; 375/342; 455/311; 455/234.2; 455/245.1
(58) Field of Classification Search ................ 455/311, 455/234.2, 245.1; 375/345, 318, 340, 342
See application file for complete search history.

(56) References Cited

U.S. PATENT DOCUMENTS 5,361,395 A * 11/1994 Yamamoto .................. 455/436

2003/0064696 A1 4/2003 Akamine et al.
2003/0207674 A1 11/2003 Hughes
2004/0192236 A1 * 9/2004 Yang et al. ................ 455/127.2

FOREIGN PATENT DOCUMENTS

EP 1324504 A2 7/2003
JP 2002111764 A 4/2002

* cited by examiner

*Primary Examiner*—Phuong Phu
(74) *Attorney, Agent, or Firm*—Sughrue Mion, PLLC

(57) ABSTRACT

In a slot format of a received signal, AGC gain update timings (t1 to t4) are shifted every time to disperse and reduce an influence of a noise attributable to a direct current component specific to direct conversion which is accompanied by AGC gain update. In particular, in the case where each of slots in the received signal includes an information portion (data) having a larger code correcting capability and an information portion having a smaller code correcting capability (TPC (transmission power control), TFCI (transport format combination indicator), PILOT), the AGC gain update timing is generated while being shifted in the former information portion, thereby reduce the influence of the noise. When the amount of shift of the AGC gain update timing is set to be larger than that of one symbol of the received signal, the influence of the noise accompanied by the AGC gain update is further reduced.

26 Claims, 9 Drawing Sheets

AGC SYSTEM, AGC METHOD, AND RECEIVER USING THE AGC SYSTEM

BACKGROUND OF THE INVENTION

1. Field of the Invention

The present invention relates to an AGC (automatic gain control) system, an AGC method, and a receiver using the AGC system. In particular, the present invention relates to an AGC system in a receiver of a CDMA (code division multiple access) system and a direct conversion system.

2. Description of the Related Art

In recent years, with the spread of a mobile phone and other wireless portable terminals, demands for downsized wireless devices, lower power consumption, and lower prices have been increasingly made. As one of wireless receiving systems that meets the above demands, there is a direct conversion system. The direct conversion system converts a received radio frequency (RF) signal into a baseband signal. In the case where the direct conversion system is used in a receiver of a wireless device that operates with a low power as with a mobile phone, it is important to remove a direct current (DC) offset voltage. The removal of the direct current offset component specific to the direct conversion system is disclosed in "Baseband circuit in a direct conversion receiver" of JP 2002-111764 A (laid open in Apr. 12, 2002).

For removing the direct offset component, the baseband circuit disclosed in the above-mentioned JP 2002-111764 A uses a filter; however, it needs a time attributable to a time constant of the filter for stabilizing the filter. Accordingly, there occurs an instability period of a received signal, that is, a noise generation period. It is necessary to suppress an influence of the instability period (noise generation period) on the signal as much as possible.

In general, in the receiver, it is necessary to change over the gain of an amplifier by using the AGC system. The amplifier connects to the filter of the receiver, and amplifies the baseband signal. When the gain is changed over, the function of removing the direct offset component is operated, and the above instability period occurs. In particular, in the DS-CDMA (direct sequence-code division multiple access)-based communication system, data is subjected to band spreading by a broadband spreading code. Accordingly, because the information is always transmitted, there is no temporal gap in received RF signal. As a result, the above instability period of the received signal leads to the deterioration of the receiving performance.

In addition, when the instable receiving state occurs at the same timing within a slot cyclically or at a specific position by a time slot (hereinafter referred to simply as "slot") of the received signal, the receiving performance is remarkably deteriorated.

SUMMARY OF THE INVENTION

The present invention has been made in view of the above, and therefore an object of the present invention is to provide a direct conversion receiver and an AGC (automatic gain control) system which suppresses an influence of the instability period of the received signal which is attributable to the gain update timing of the AGC on the received signal as much as possible.

According to an aspect of the present invention, there is provided an AGC system which is used in a receiver of a direct conversion system, including controller for controlling an AGC gain update timing in a slot format of a received signal.

The controller may generate a first AGC gain update timing at a first position within one slot of the received signal, and may generate a second AGC gain update timing subsequent to the first AGC gain update timing at a second position different from the first position within another slot.

Further, when each of the slots of the received signal includes a first information portion having a predetermined code correcting capability and a second information portion having a code correcting capability smaller than the predetermined code correcting capability, the controller may generate the AGC gain update timing at the first information portion. Further, the received signal has a slot format of a CDMA system, and the amount of shift of the AGC gain update timing is preferably set to be larger than a period corresponding to one reception symbol of the CDMA system.

According to another aspect of the present invention, there is provided an AGC system in a receiver of a direct conversion system, including a control step for controlling an AGC gain update timing in a slot format of a received signal.

Further, the control step may include generating a first AGC gain update timing at a first position within one slot of the received signal, and generating a second AGC gain update timing subsequent to the first AGC gain update timing at a second position different from the first position within another slot.

According to another aspect of the present invention, there is provided a program for causing a computer to execute an AGC method in a receiver of a direct conversion system, having a control process for controlling shift of an AGC gain update timing in a slot format of a received signal.

The following are operations of the present invention. That is, in a slot format of a received signal, AGC gain update timings are shifted every time to disperse and reduce an influence of a noise attributable to a direct current component specific to direct conversion which is accompanied by AGC gain update. In particular, in the case where each of slots in the received signal includes an information portion having a larger code correcting capability and an information portion having a smaller code correcting capability (CDMA system), the AGC gain update timing is generated while being shifted in the information portion having a larger code correcting capability, thereby reduce the influence of the noise. Also, since the amount of shift of the AGC gain update timing is made larger than one symbol of the received signal, an influence of the noises accompanied by the AGC gain update is further reduced.

According to the present invention, the timing of setting the AGC gain is shifted in the slot format of the received signal each time, so that a portion where there occurs the instability period of the received signal due to the direct-current component specific to the direct conversion system, is shifted. An influence of the instability period on the received signal can be reduced as much as possible, thereby making it possible to improve the error rate of the signal.

BRIEF DESCRIPTION OF THE DRAWINGS

These and other aspects, features and advantages of the invention will become more fully apparent from the following detailed description taken in conjunction with accompanying drawings. In the drawings.

DETAILED DESCRIPTION OF THE PREFERRED EMBODIMENT

Figure 1:
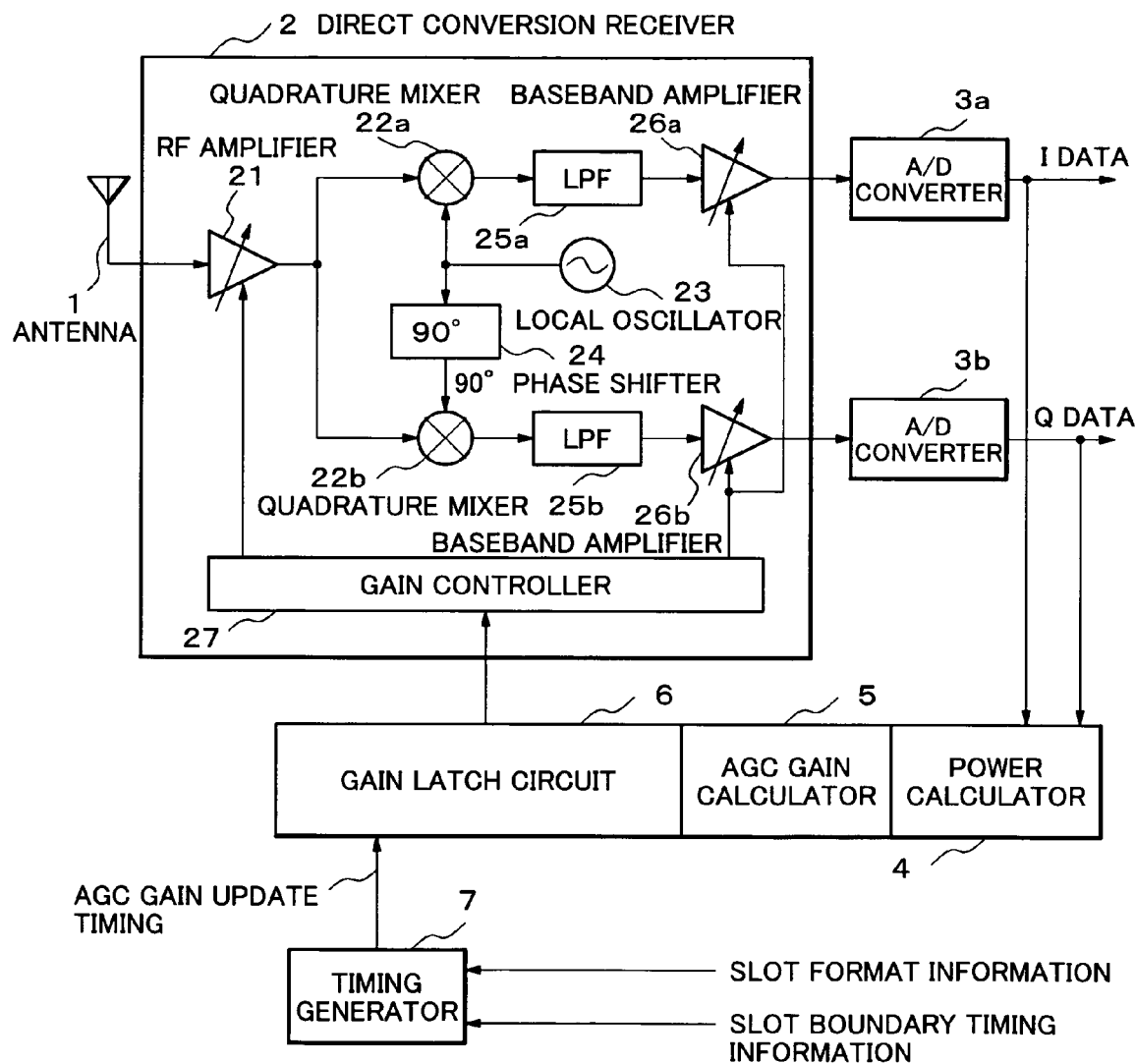
FIG. 1 is a block diagram showing an embodiment according to the present invention.

Hereinafter, a description will be given in more detail of preferred embodiments of the present invention with reference to the accompanying drawings. FIG. 1 is a block diagram showing an embodiment of the present invention. Referring to FIG. 1, a received radio signal is inputted from an antenna 1 to a direct conversion receiver 2. The direct conversion receiver 2 includes a radio frequency amplifier (RF amplifier) 21, quadrature mixers 22a and 22b, a local oscillator 23, a 90-degree phase shifter 24, LPFs (low-pass filters) 25a and 25b, baseband amplifiers 26a and 26b, and a gain controller 27. The operation of the direct conversion receiver 2 has been disclosed in detail in "Direct conversion receiver" of JP 10-308684 A (laid open in Nov. 17, 1998), and well known, and therefore its description will be omitted.

IQ signals (I data, Q data) that have been outputted from the direct conversion receiver 2 are supplied to A/D (analog-to-digital) converters 3a and 3b, respectively, and then subjected to A/D conversion. The A/D converted outputs become digital data (I data, Q data), and are supplied to a digital signal processor (not shown) and also supplied to a power calculator 4 for AGC. A power value calculated by the power calculator 4 is supplied to an AGC gain calculator 5. The AGC gain calculator 5 calculates the AGC gain of the amplifier in the direct conversion receiver 2.

The AGC gain thus calculated is latched by a gain latch circuit 6. The gain latch circuit 6 latches the gain value until an AGC gain update timing signal is inputted to the gain latch circuit 6 from a timing generator 7. Upon receiving the AGC gain update timing signal from the timing generator 7, the gain latch circuit 6 outputs the latched AGC gain to the gain controller 27 of the direct conversion receiver 2 at that timing. In this manner, the AGC gain is updated.

Figure 2:
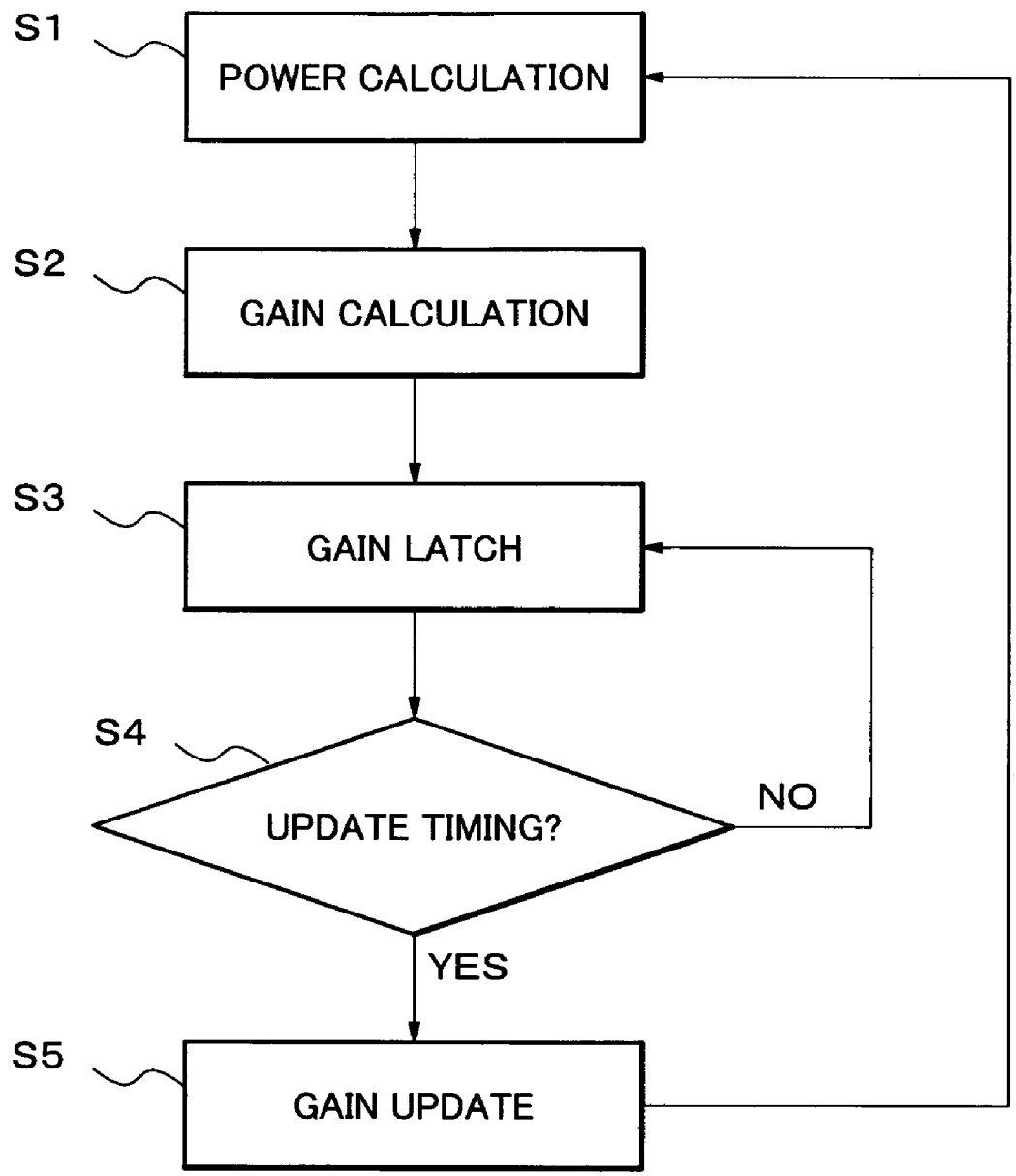
FIG. 2 is a flowchart showing an operation of the embodiment according to the present invention.

FIG. 2 is a flowchart showing the operation of the embodiment according to the present invention. The power calculator 4 calculates a received power (Step S1). The AGC gain calculator 5 calculates the AGC gain of the direct conversion receiver 2 on the basis of a difference between the calculated received power value and a convergence target of AGC (Step S2). The AGC gain thus obtained is latched and temporarily held by the gain latch circuit 6.

Then, in the timing generator 7, it is judged whether the update timing of the AGC gain is reached or not (Step S4). If the update timing is reached, the AGC gain update timing signal is generated from the timing generator 7, and the latched AGC gain is read from the gain latch circuit 6. In this manner, the AGC gain is updated (Step S5). After the AGC gain has been updated, the operation is again returned to Step S1, and the same operation is repeated.

Figure 3:
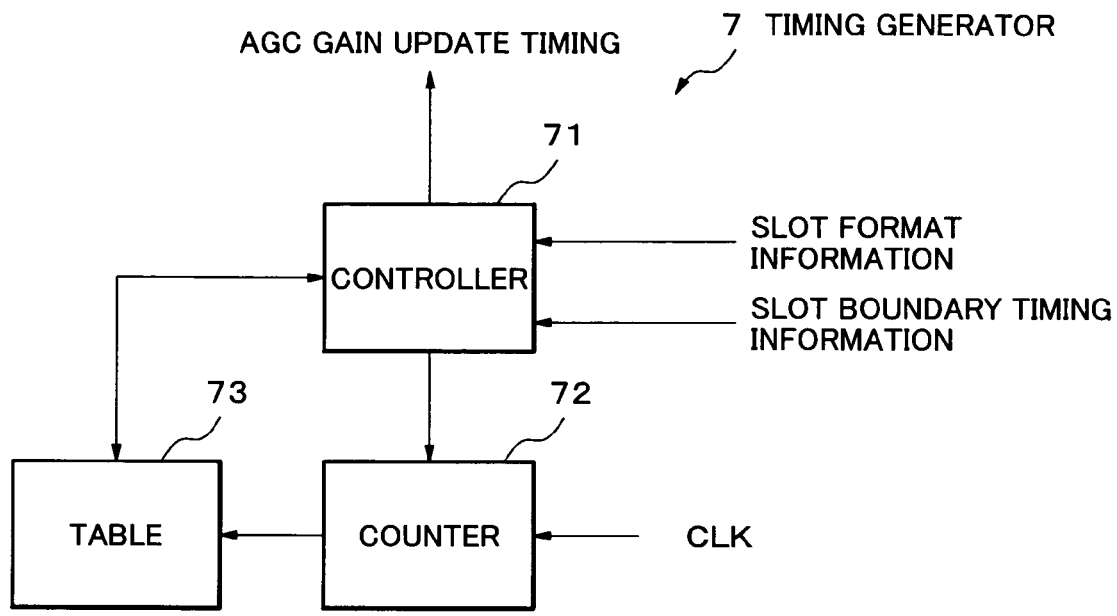
FIG. 3 is a block diagram showing functions of a timing generator shown in FIG. 1.

FIG. 3 is a block diagram showing the functions of the timing generator 7 in FIG. 1. The timing generator 7 has a controller 71, a counter 72, and a table 73 for AGC gain update timing generation. The controller 71 inputs received signal slot format information and slot boundary timing information from a digital signal processor (not shown). The controller 71 controls the counter 72 and the table 73 on the basis of the inputted information. The counter 72 counts clocks in synchronism with the received data with the slot boundary timing information as a trigger. Accordingly, the output of the counter 72 represents the present timing position within the respective slots.

In this example, the table 73 is a table that combines the respective slot format information of the received signal with the AGC gain update timing information. The controller 71 reads the AGC gain update timing for each of the slots from the table 73 on the basis of the inputted slot format information and the current timing position information within the respective slots of the counter 72, and derives the read timing as the AGC gain update timing.

Figure 4:
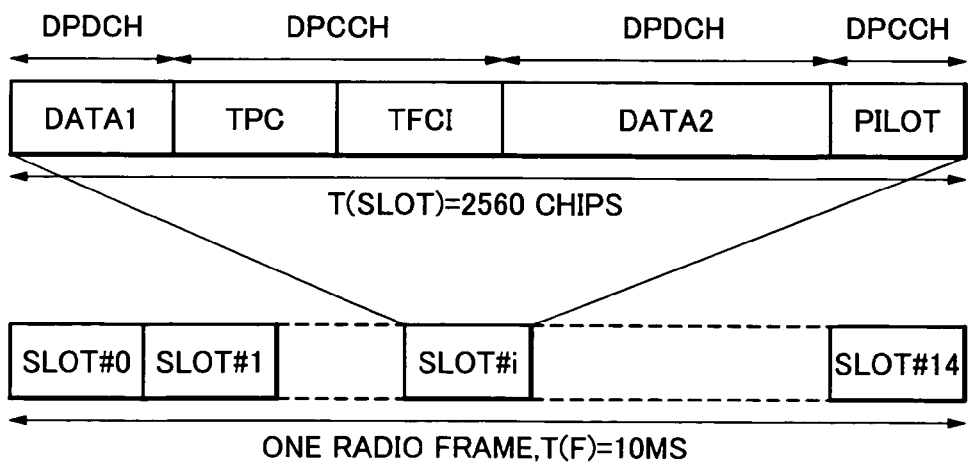
FIG. 4 is a diagram showing a slot and frame format of a down-link DPCH regulated by 3GPP (third generation partnership project)

FIG. 4 shows a slot and frame format of a down-link DPCH (dedicated physical channel) regulated by 3GPP (Third Generation Partnership Project). One frame of the down-link DPCH consists of 15 slots, and each of the slots consists of a DPDCH (dedicated physical data channel) and a DPCCH (dedicated physical control channel). The DPDCH consists of data 1 and data 2. The DPCCH consists of a TPC (transmission power control) that is power control information, a TFCI (transport format combination indicator) that is feedback information, and a pilot that is a pilot signal.

Also, the slot format information is information indicative of the slot format shown in FIG. 4 The slot boundary timing information is information indicative of the slot boundary position.

Accordingly, the timing generator 7 calculates the current timing within the respective slots by means of the counter 72 on the basis of the slot boundary timing information and the slot format information shown in FIG. 4. Then, referring to the table 73, the AGC gain update timing is outputted from the controller 71, for example, at timings t1 to t4 shown in FIG. 5 (first to fourth positions) for each of the slots.

Figure 5:
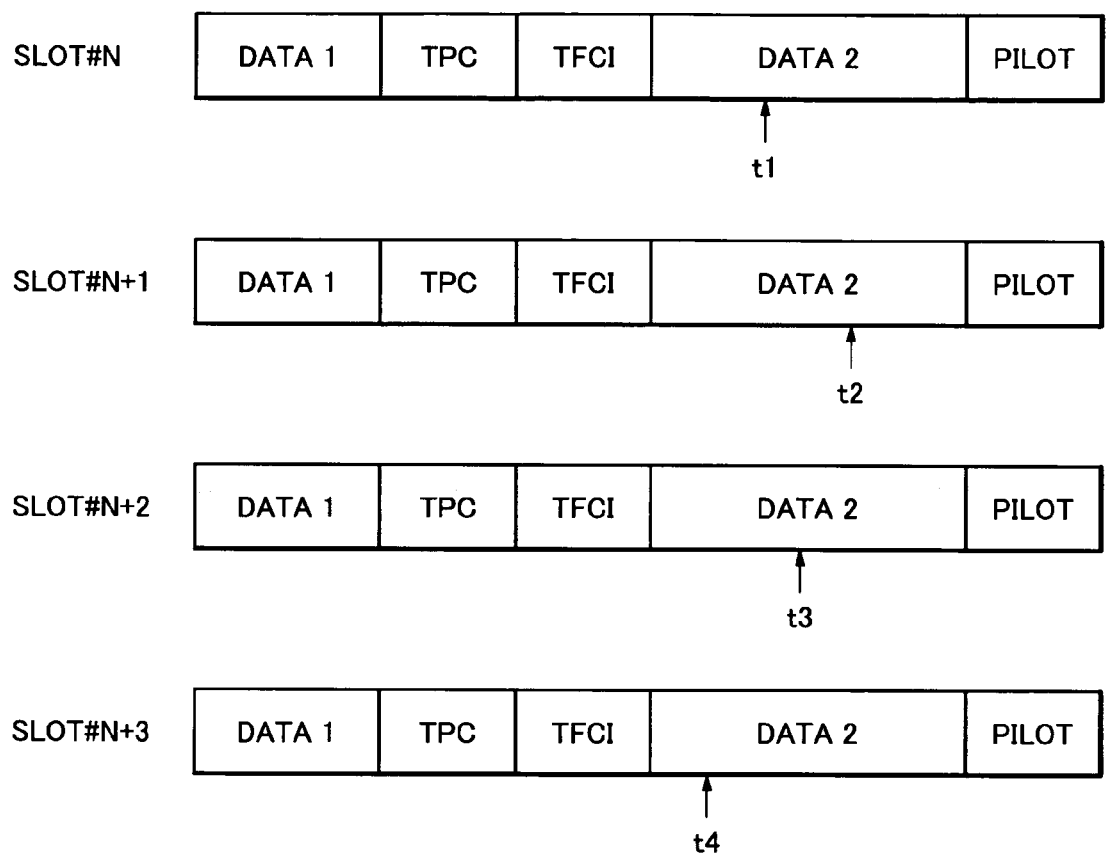
FIG. 5 is a diagram showing a first example of transition of an AGC gain update timing;.

In this case, the table 73 stores therein the information of the respective timing positions (t1 to t4) with reference to the slot boundary for each of the slots, as shown in FIG. 5. The counter 72 starts to count up the clocks with the slot boundary as a trigger, and when the count value coincides with the information of the storage timing positions corresponding to the slot formats (for example, slot No.), respectively, the controller 71 outputs the slot AGC update timing signal at that time.

As shown in FIG. 5, the reason that the AGC gain update timing is shifted for each of the slots is to prevent the update of the AGC gain from being conducted at the symbol position of the same W-CDMA (Wideband-CDMA) in each slot. Accordingly, the amount of shift of the AGC gain update timing for each of the slots is required to be larger than a period corresponding to one symbol. Thus, the shift of the respective AGC gain update timings by the symbol unit in the above manner can be readily realized by using the table 73 combining the slot format information and the AGC gain update timing as described above.

Figure 6:
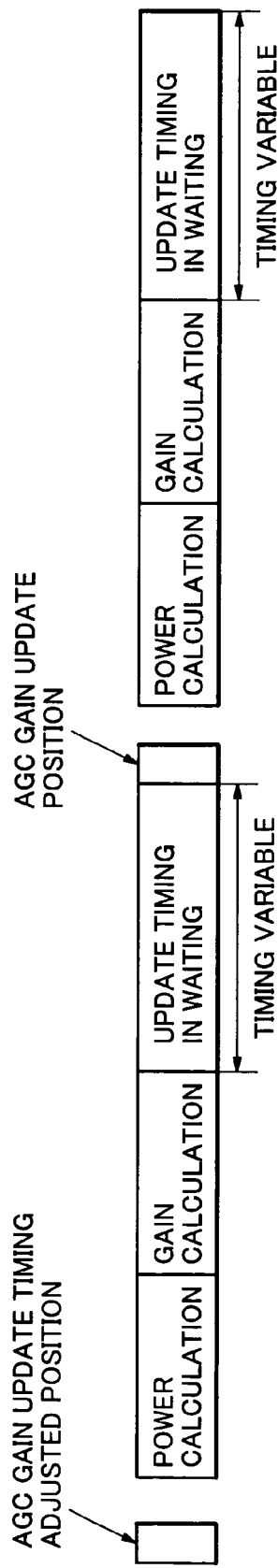
FIG. 6 is a diagram showing an AGC gain update timing adjusted position;.

Also, the AGC gain update timing can be absorbed in a period indicated as "update timing in waiting" as shown in FIG. 6. FIG. 6 shows a relationship of a period of "update timing in waiting", a period of "power calculation", and a period of "gain calculation".

As shown in FIG. 5, the AGC gain update timing is set as a data portion (DPDCH) in each of the slots. The reason is stated below. In the down-link DPCH applied to IMT-2000 (International Mobile Telecommunications 2000) of 3GPP (Third Generation Partnership Project), the DPCCH is not subjected to error correcting, and weak in disturbance. Also, the DPDCH portion is subjected to convolutional codes correcting on a slot format basis. In the case where the instability period occurs at a specific position of the slot format (that is, the same position in each of the slots) due to the AGC gain update each time, the characteristics are remarkably deteriorated. For that reason, the AGC gain update timing occurs only at the DPDCH portion where the error correcting is conducted. In addition, the timing is shifted for each slot by a period longer than the one-symbol corresponding period under the control.

Figure 7:
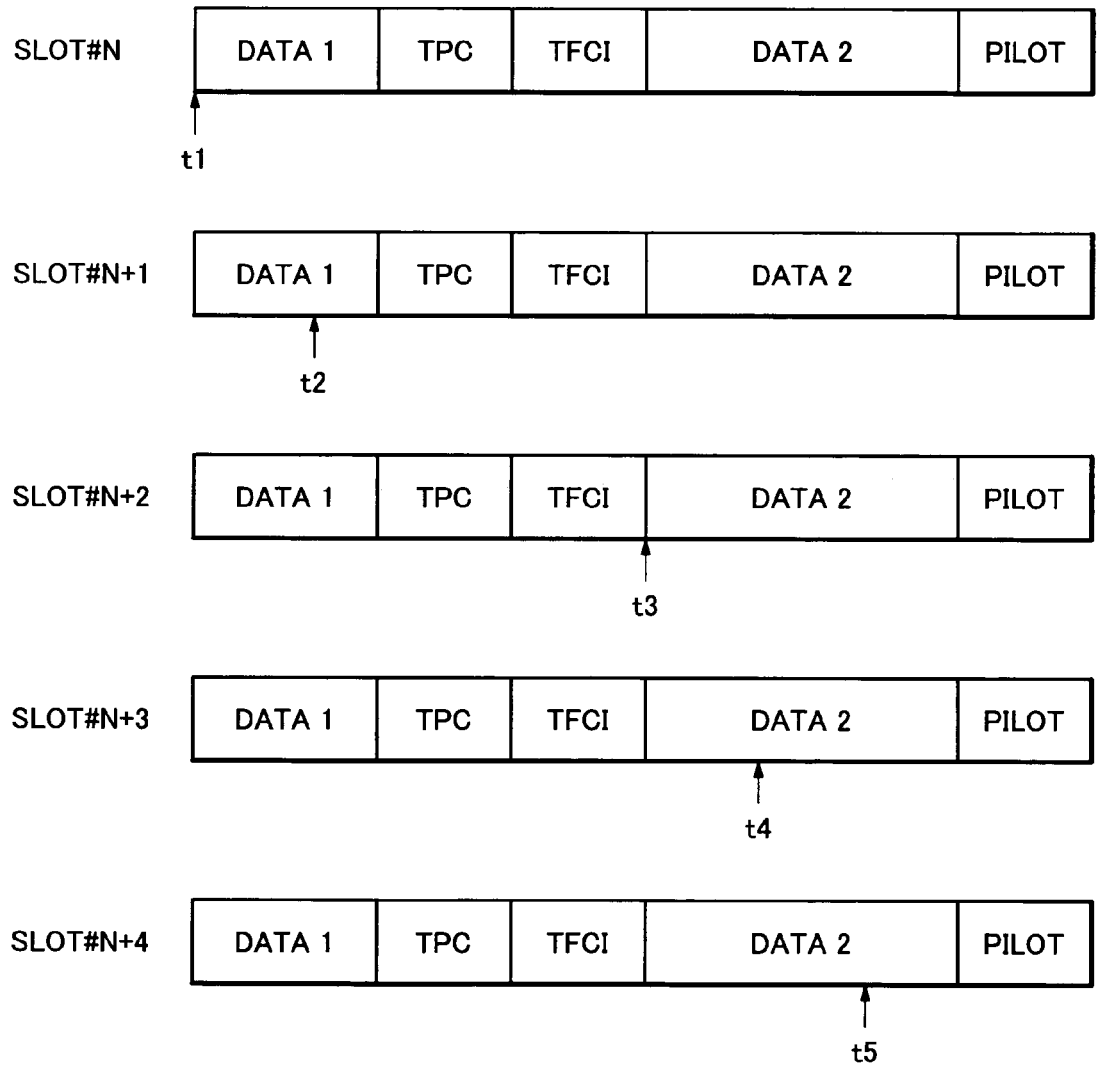
FIG. 7 is a diagram showing a second example of transition of the AGC gain update timing.
Figure 8:
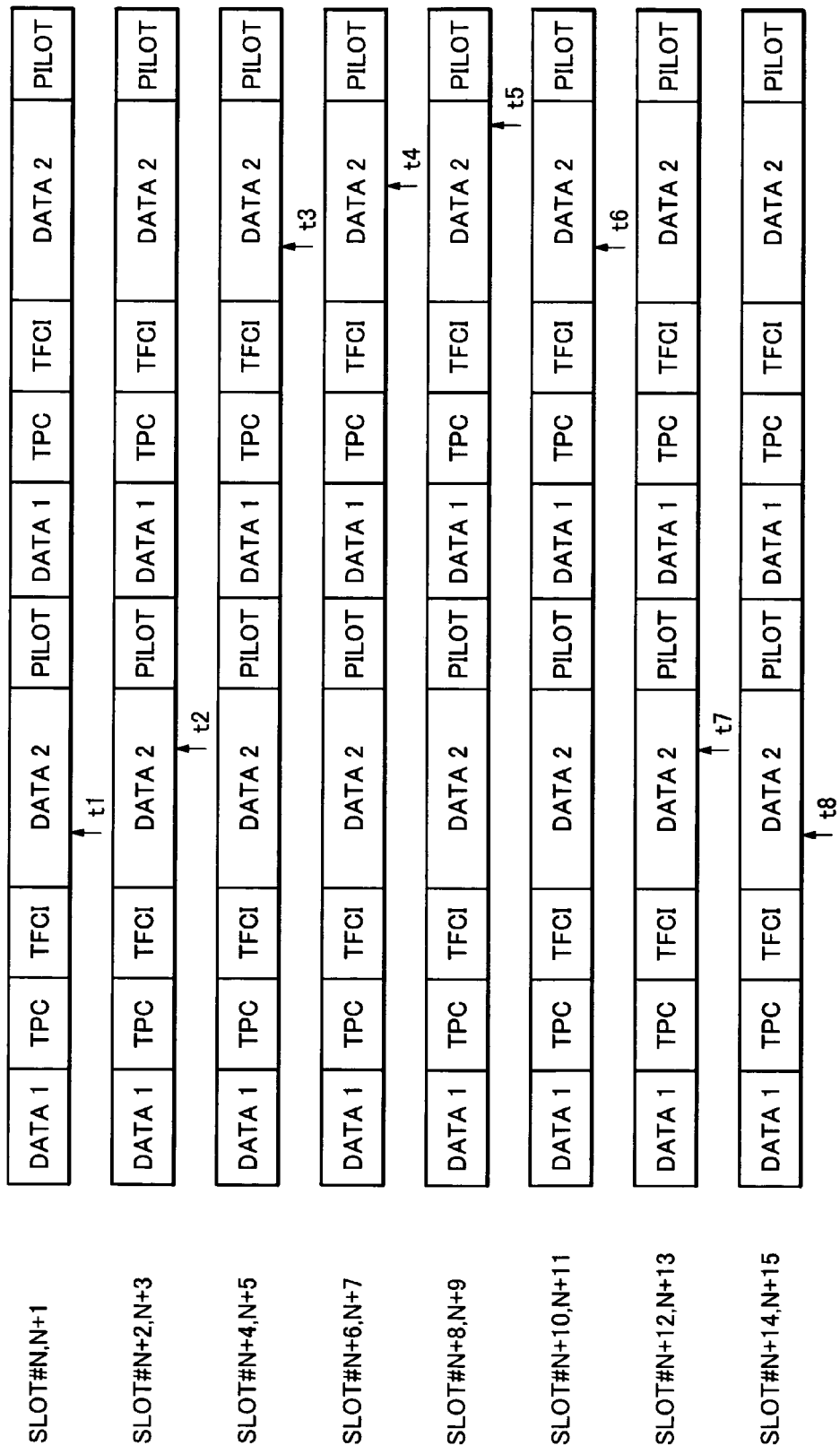
FIG. 8 is a diagram showing a third example of transition of the AGC gain update timing.
Figure 9:
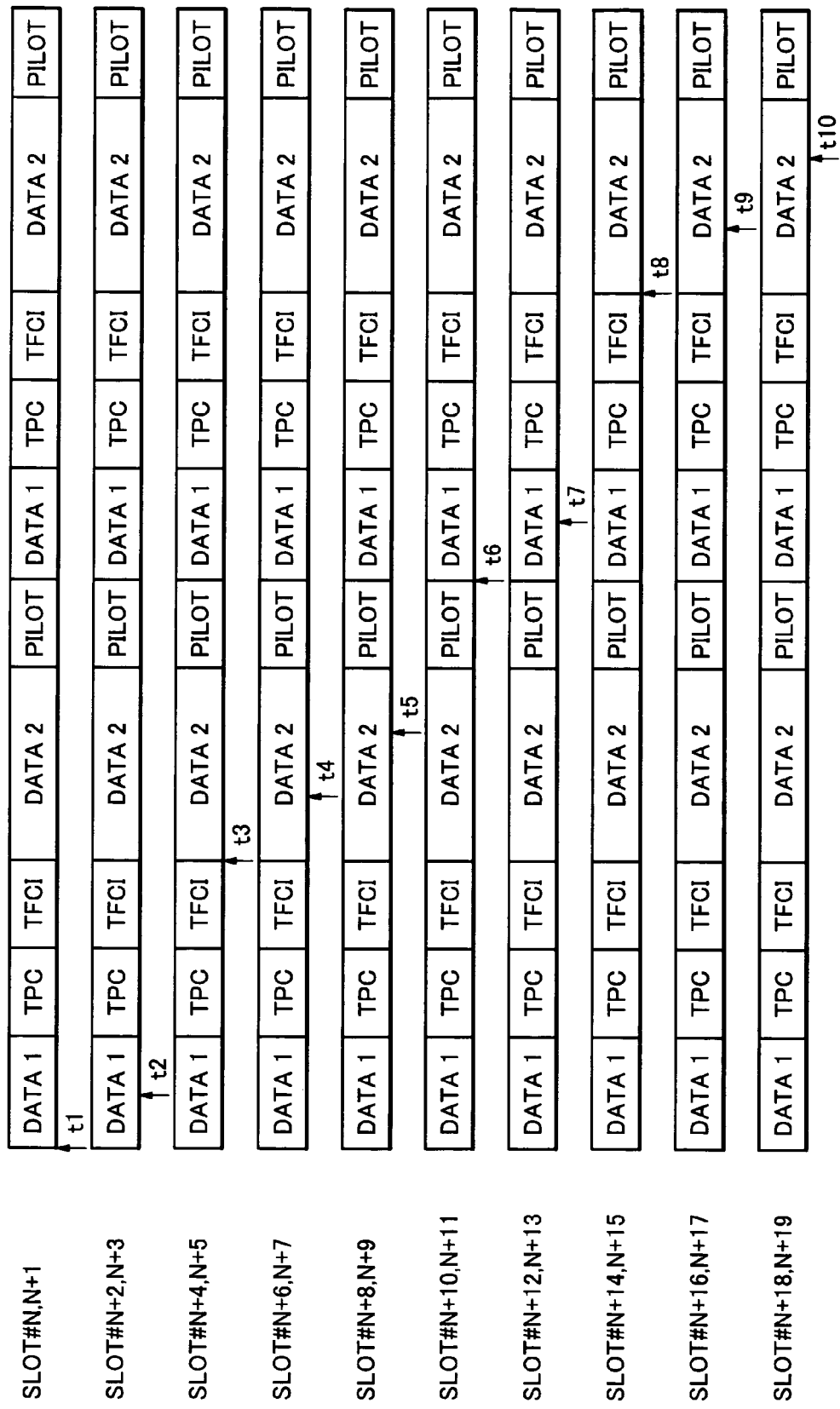
FIG. 9 is a diagram showing a fourth example of transition of the AGC gain update timing.
Figure 10:
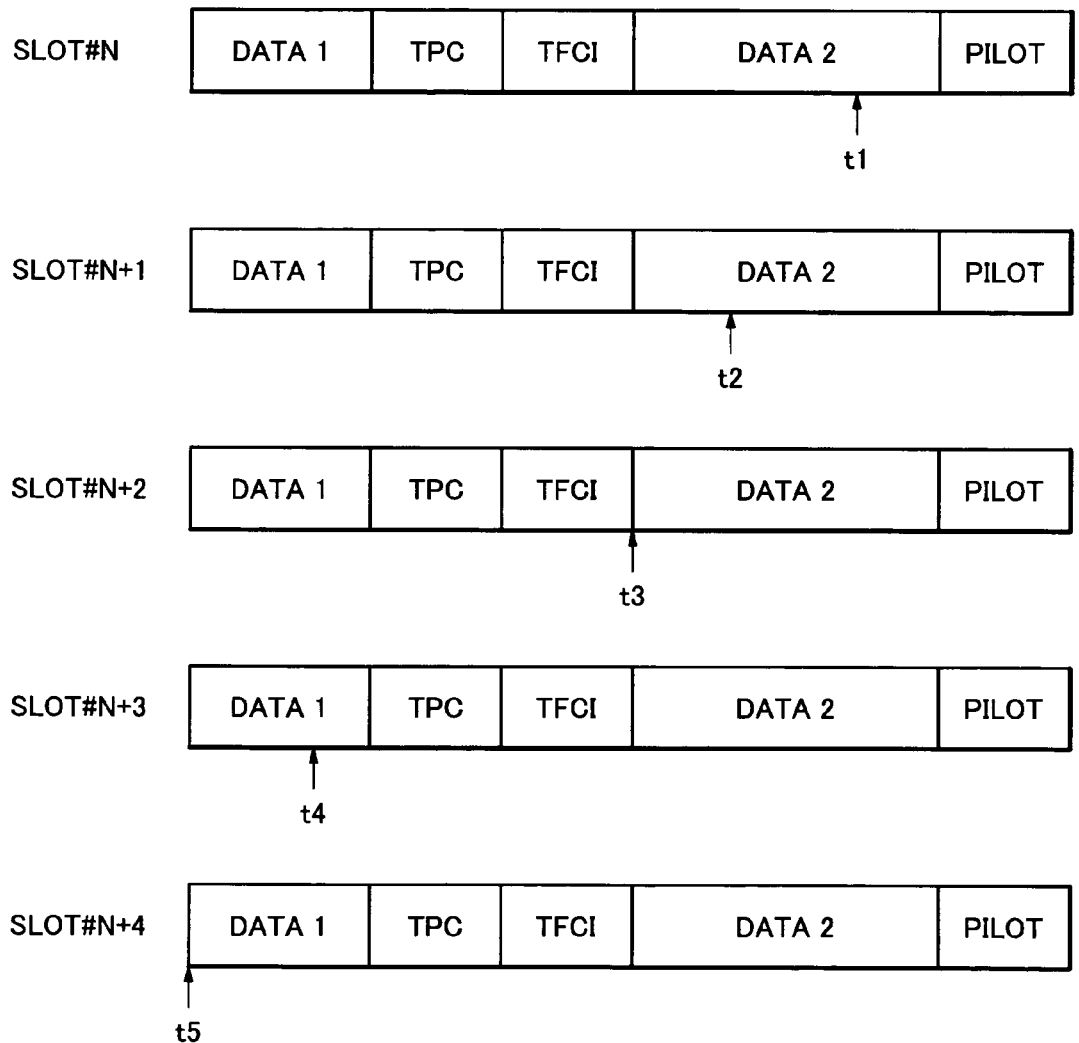
FIG. 10 is a diagram showing a fifth example of transition of the AGC gain update timing.

FIG. 7 is a diagram showing another example of the transition of the AGC gain update timing. In the example shown in FIG. 5, the AGC gain update timing is shifted only at the portion of data 2 of the DPDCH. In the example shown in FIG. 7 (t1 to t5), the AGC gain update timing is shifted only at the portion of data 1 and data 2 of the DPDCH. FIGS. 8 to 10 are diagrams showing a third, a fourth and a fifth examples of the transition of the AGC gain update timing, respectively. In the above examples shown in. FIGS. 5 and 7, the AGC gain update timing is shifted for each of the slots, respectively. However, in FIG. 8 (t1 to t8) and FIG. 9 (t1 to t10), the AGC gain update timing is shifted for every two slots, respectively. The present invention is not limited to every slot or every two slots. For example, the AGC gain update timing may be shifted for every 15 slots that constitute one frame, respectively.

Also, in the examples of FIGS. 5 and 7, a period between one AGC gain update timing and a subsequent update timing is set to a period longer than one slot. However, in FIG. 10 (t1 to t5), the period is shorter than one slot. It is apparent that the control of the AGC gain update timing can be variously modified. In addition, the timing generator 7 shown in FIG. 1 may be constituted by hardware as shown in FIG. 3. Alternatively, operating procedures may naturally be recorded in a ROM (read only memory) or the like as a program, and read by a CPU (computer) for execution thereof.

What is claimed is:

1. An automatic gain control (AGC) system, comprising:
a controller in a direct conversion system which converts a received signal directly from RF to baseband, wherein said controller controls an AGC gain update timing in a slot format of the received signal to occur in different positions within subsequent slots of the received signal in a specified sequence.

2. An AGC system according to claim 1, wherein the controller generates a first AGC gain update timing at a first position within one slot of the received signal, and generates a second AGC gain update timing subsequent to the first AGC gain update timing at a second position different from the first position within another slot.

3. An AGC system which is used in a receiver of a direct conversion system, comprising:
a controller which controls an AGC gain update timing in a slot format of a received signal to occur in different positions within subsequent slots of the received signal in a specified sequence,
wherein each of the slots of the received signal includes a first information portion having a predetermined code correcting capability and a second information portion having a code correcting capability smaller than the predetermined code correcting capability; and
the controller generates the AGC gain update timing at the first information portion.

4. An AGC system which is used in a receiver of a direct conversion system, comprising:
a controller which controls an AGC gain update timing in a slot format of a received signal to occur in different positions within subsequent slots of the received signal in a specified sequence,
wherein the received signal has a slot format of a CDMA system, and
the amount of shift of the AGC gain update timing is set to be larger than a period corresponding to one reception symbol of the CDMA system.

5. A receiver which has the AGC system according to claim 1.

6. An automatic gain control (AGC) method, comprising:
controlling, in a receiver comprising a direct conversion system which converts a received signal directly from RF to baseband, an AGC gain update timing in a slot format of the received signal to occur in different positions within subsequent slots of the received signal in a specified sequence.

7. An AGC method according to claim 6, which is used in a receiver of a direct conversion system, comprising:
controlling wherein the controlling the AGC gain update timing comprises:
generating a first AGC gain update timing at a first position within one slot of the received signal; and
generating a second AGC gain update timing subsequent to the first AGC gain update timing at a second position different from the first position within another slot.

8. An AGC method which is used in a receiver of a direct conversion system, comprising:
controlling an AGC gain update timing in a slot format of a received signal to occur in different positions within subsequent slots of the received signal in a specified sequence,
wherein each of the slots of the received signal includes a first information portion having a predetermined code correcting capability and a second information portion having a code correcting capability smaller than the predetermined code correcting capability; and
the control step comprises generating the AGC gain update timing at the first information portion.

9. An AGC method which is used in a receiver of a direct conversion system, comprising:
controlling an AGC gain update timing in a slot format of a received signal to occur in different positions within subsequent slots of the received signal in a specified sequence,
wherein the received signal has a slot format of a CDMA system, and
the amount of shift of the AGC gain update timing is set to be larger than a period corresponding to one reception symbol of the CDMA system.

10. A computer readable medium having stored therein a program for causing a computer to execute an automatic gain control (AGC) method, said program including computer executable instructions for performing a control process for controlling, in a receiver comprising a direct conversion system which converts a received signal directly from RF to baseband, shift of an AGC gain update timing in a slot format of the received signal in a specified sequence.

11. An automatic gain control (AGC) system, comprising:
a gain latch circuit which latches a calculated gain value and outputs the calculated gain value at an AGC update time occurring in different positions within subsequent slots of a received signal in a specified sequence; and a timing generator which controls the AGC update time for outputting the calculated gain value from the latch circuit.

12. The AGC system according to claim 11, wherein the timing generator inputs slot format information and slot boundary timing information of a received signal.

13. An automatic gain control (AGC system, comprising:

a gain latch circuit which latches a calculated gain value and outputs the calculated gain value at an AGC update time; and a timing generator which controls the AGC update time for outputting the calculated gain value from the latch circuit, wherein the timing generator inputs slot format information and slot boundary timing information of a received signal, and wherein the timing generator comprises a counter which outputs a representation of a timing position within a slot of the received signal, wherein the counter is triggered by the slot boundary timing information.

14. The AGC system according to claim 13, wherein the timing generator further comprises a table which combines the slot format information of the received signal with the timing position within the slot of the received signal output by the counter.

15. The AGC system according to claim 14, wherein the timing generator further comprises a controller which accesses the slot format information and the timing position within the slot from the table, derives the AGC gain update time, and outputs the AGC gain update time to the gain latch circuit.

16. The AGC system according to claim 15, wherein the controller derives a first AGC gain update timing and outputs the first AGC gain update timing at a first position in one time slot of the received signal within a portion of the one slot having a predetermined code correcting capability, and derives a second AGC gain update timing and outputs the second AGC update timing subsequent to the first AGC gain update timing at a second position different from the first position in another slot of the received signal within a portion of the another slot having a predetermined code correcting capability.

17. The AGC system according to claim 16, wherein each of the slots of the received signal includes a first information portion having a predetermined code correcting capability and a second information portion having a code correcting capability smaller than the predetermined code correcting capability.

18. An AGC system according to claim 1, wherein:

each of the slots of the received signal includes a first information portion having a predetermined code correcting capability and a second information portion having a code correcting capability smaller than the predetermined code correcting capability; and the controller generates the AGC gain update timing at the first information portion.

19. An AGC system according to claim 1, wherein:

the received signal has a slot format of a CDMA system; and the amount of shift of the AGC gain update timing is set to be larger than a period corresponding to one reception symbol of the CDMA system.

20. An AGC method according to claim 6, wherein:

each of the slots of the received signal includes a first information portion having a predetermined code correcting capability and a second information portion having a code correcting capability smaller than the predetermined code correcting capability; and the control step comprises generating the AGC gain update timing at the first information portion.

21. An AGC method according to claim 6, wherein:

the received signal has a slot format of a CDMA system; and the amount of shift of the AGC gain update timing is set to be larger than a period corresponding to one reception symbol of the CDMA system.

22. The AGC system according to claim 12, wherein the timing generator comprises a counter which outputs a representation of a timing position within a slot of the received signal, wherein the counter is triggered by the slot boundary timing information.

23. The AGC system according to claim 22, wherein the timing generator further comprises a table which combines the slot format information of the received signal with the timing position within the slot of the received signal output by the counter.

24. The AGC system according to claim 23, wherein the timing generator further comprises a controller which accesses the slot format information and the timing position within the slot from the table, derives the AGC gain update time, and outputs the AGC gain update time to the gain latch circuit.

25. The AGC system according to claim 24, wherein the controller derives a first AGC gain update timing and outputs the first AGC gain update timing at a first position in one time slot of the received signal within a portion of the one slot having a predetermined code correcting capability, and derives a second AGC gain update timing and outputs the second AGC update timing subsequent to the first AGC gain update timing at a second position different from the first position in another slot of the received signal within a portion of the another slot having a predetermined code correcting capability.

26. The AGC system according to claim 25, wherein each of the slots of the received signal includes a first information portion having a predetermined code correcting capability and a second information portion having a code correcting capability smaller than the predetermined code correcting capability.

* * * * *